(12) United States Patent
Fattal et al.

(10) Patent No.: US 8,369,664 B2
(45) Date of Patent: Feb. 5, 2013

(54) OPTICAL APPARATUS FOR FORMING A TUNABLE CAVITY

(75) Inventors: David A. Fattal, Mountain View, CA (US); Marco Fiorentino, Mountain View, CA (US); Jingjing Li, Palo Alto, CA (US); Raymond G. Beausoleil, Redmond, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 286 days.

(21) Appl. No.: 12/847,429

(22) Filed: Jul. 30, 2010

(65) Prior Publication Data
US 2012/0027348 A1    Feb. 2, 2012

(51) Int. Cl.
*G02B 6/34*    (2006.01)
(52) U.S. Cl. ......................................... 385/37
(58) Field of Classification Search ................. 385/37, 385/38
See application file for complete search history.

(56) References Cited

U.S. PATENT DOCUMENTS

| | | | |
|---|---|---|---|
| 4,553,840 A * | 11/1985 | Nogami et al. ............... | 356/333 |
| 4,911,516 A * | 3/1990 | Palfrey et al. ................ | 385/37 |
| 6,172,811 B1 * | 1/2001 | Wood et al. ................... | 359/573 |
| 6,488,414 B1 * | 12/2002 | Dawes et al. .................. | 385/79 |
| 6,661,952 B2 | 12/2003 | Simpson et al. | |
| 6,741,624 B2 | 5/2004 | Mears et al. | |
| 6,757,463 B2 | 6/2004 | Hutchinson et al. | |
| 6,954,271 B2 * | 10/2005 | Curtiss .......................... | 356/328 |
| 7,096,498 B2 | 8/2006 | Judge | |
| 7,167,615 B1 * | 1/2007 | Wawro et al. ................. | 385/37 |
| 7,184,625 B2 | 2/2007 | Gunn, III et al. | |
| 7,190,875 B2 | 3/2007 | Anderson et al. | |
| 7,317,739 B2 * | 1/2008 | Chou et al. ..................... | 372/18 |
| 7,654,750 B2 * | 2/2010 | Brenner et al. ................ | 385/89 |
| 7,680,371 B2 | 3/2010 | Cheben et al. | |
| 8,175,430 B2 * | 5/2012 | Peng et al. ..................... | 385/37 |
| 2002/0073338 A1 | 6/2002 | Burrows et al. | |
| 2005/0013334 A1 | 1/2005 | Watanabe et al. | |
| 2006/0098694 A1 * | 5/2006 | Hongo .............................. | 372/6 |
| 2008/0226217 A1 * | 9/2008 | Kilic et al. ..................... | 385/12 |
| 2009/0022448 A1 | 1/2009 | Wu et al. | |
| 2011/0188805 A1 * | 8/2011 | Fu et al. ......................... | 385/37 |

FOREIGN PATENT DOCUMENTS

JP    58059401    * 4/1983

OTHER PUBLICATIONS

"Fiber Fabry-Perot cavity with high finesse", David Hunger, Tilo Steinmetz, Yves Colombe, Christian Deutsch, Theodor W. Hansch, and Jakob Reichel, New J. Phys., May 1, 2010.

(Continued)

*Primary Examiner* — Charlie Peng

(57) ABSTRACT

An optical apparatus includes an optical fiber formed of a core surrounded by cladding, in which the optical fiber includes an end portion. In addition, an optical layer composed of a material having a relatively high refractive index is positioned on the end portion, in which the optical layer includes a non-periodic sub-wavelength grating positioned in optical communication with the core.

20 Claims, 14 Drawing Sheets

OTHER PUBLICATIONS

"A novel ultra-low loss hollow-core waveguide using subwavelength high-contrast gratings", Ye Zhou, Vadim Karagodsky, Bala Pesala, Forrest G. Sedgwick, and Connie J. Chang-Hasnain, Department of Electrical Engineering and Computer Sciences, University of California, Berkeley, California, Optical Society of America, 2009.

Francesco Marino et al., "Single Mode Operation and Transverse Mode Control in VCSELs Induced by Frequency Selective Feedback", 3 pages, Dept. de Fisica Interdisciplinar, Instituto Mediteraneo de Estudios Avanzados (CSIC-UIB), C/Miquel Marques 21, E-07190 Esporles, Spain, Jun. 2003.

Ye Zhou et al., "Transverse Mode Control in High-Contrast Subwavelength Grating VCSEL", 2 pages, Dept. of Electrical Engineering and Computer Sciences, University of California, Berkeley, USA, May 6-11, 2007.

David Fattal et al., "Flat Dielectric Grating Reflectors with High Focusing Power", 8 pages, <http://arvix.org/PScache/arxiv/pdf/1001/1001.3711v1.pdf>, Jan. 21, 2010.

* cited by examiner

US 8,369,664 B2

OPTICAL APPARATUS FOR FORMING A TUNABLE CAVITY

CROSS-REFERENCE TO RELATED APPLICATION

The present application has the same Assignee and shares some common subject matter with PCT Application No. PCT/US2009/051026, entitled "NON-PERIODIC GRATING REFLECTORS WITH FOCUSING POWER AND METHODS FOR FABRICATING THE SAME", filed on Jul. 17, 2009, PCT Application Ser. No. PCT/US2009/058006, entitled "OPTICAL DEVICES BASED ON DIFFRACTION GRATINGS", filed on Sep. 23, 2009, U.S. patent application Ser. No. TBD, entitled "DYNAMICALLY VARYING AN OPTICAL CHARACTERISTIC OF A LIGHT BEAM", filed on Jan. 29, 2010, PCT Application No. TBD, filed on Jan. 29, 2010, entitled "VERTICAL-CAVITY SURFACE-EMITTING LASERS WITH NON-PERIODIC GRATINGS", and U.S. patent application Ser. No. 12/767,474, entitled "VERTICAL-CAVITY SURFACE-EMITTING LASER", filed on Apr. 26, 2010, the disclosures of which are hereby incorporated by reference in their entireties.

BACKGROUND

Optical components are being increasingly implemented for various applications, including cavity quantum electrodynamics and quantum dot spectroscopy. These types of applications typically employ two reflectors that are spaced apart from each other with a light emitting layer sandwiched between the two reflectors. The reflectors are typically distributed Bragg reflectors ("DBRs") that ideally form a reflective cavity with greater than 99% reflectivity for optical feedback. DBRs are composed of multiple alternating layers, each layer composed of a dielectric or semiconductor material with periodic refractive index variation.

Conventional optical components are manufactured such that the positions of both reflectors are fixed with respect to each other. As such, in instances where the distances between the reflectors are outside of preselected distances due to, for instance, manufacturing imperfections, the optical components are typically required to be re-manufactured. In addition, multiple conventional optical components are often manufactured with the reflectors positioned at different distances with respect to each other. The fabrication of multiple versions of the optical components required in conventional optical systems often requires a great deal of additional labor and expense.

BRIEF DESCRIPTION OF THE DRAWINGS

Embodiments are illustrated by way of example and not limited in the following figure(s), in which like numerals indicate like elements, in which.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures are not described in detail so as not to unnecessarily obscure the description of the embodiments.

Disclosed herein are embodiments directed to an optical apparatus having an optical fiber configured to collect light emitted by one or more light emitters. The optical fiber includes an optical layer composed of a material having a relatively high refractive index positioned on an end portion thereof. The optical layer includes a non-periodic sub-wavelength grating (NPSWG) positioned in optical communication with an optical core of the optical fiber, in which the NPSWG is configured to reflect light around a predetermined range of wavelengths with a relatively small amount of loss along at least one dimension. The optical apparatus may also include a reflective device positioned with respect to the NPSWG to form a relatively high quality factor mode cavity therebetween. The position of at least one of the optical fiber and the reflective device is configured to be varied with respect to the other one of the optical fiber and the reflective device to enable at least one of the lateral position and resonance frequency of the cavity to be modified or tuned. In this regard, for instance, the position of the optical fiber and/or the reflective device may be modified to improve operations performed, for instance, in cavity quantum electrodynamics and quantum dot spectroscopy.

In the following description, the term "light" refers to electromagnetic radiation with wavelengths in the visible and non-visible portions of the electromagnetic spectrum, including infrared and ultra-violet portions of the electromagnetic spectrum.

Figure 1A:
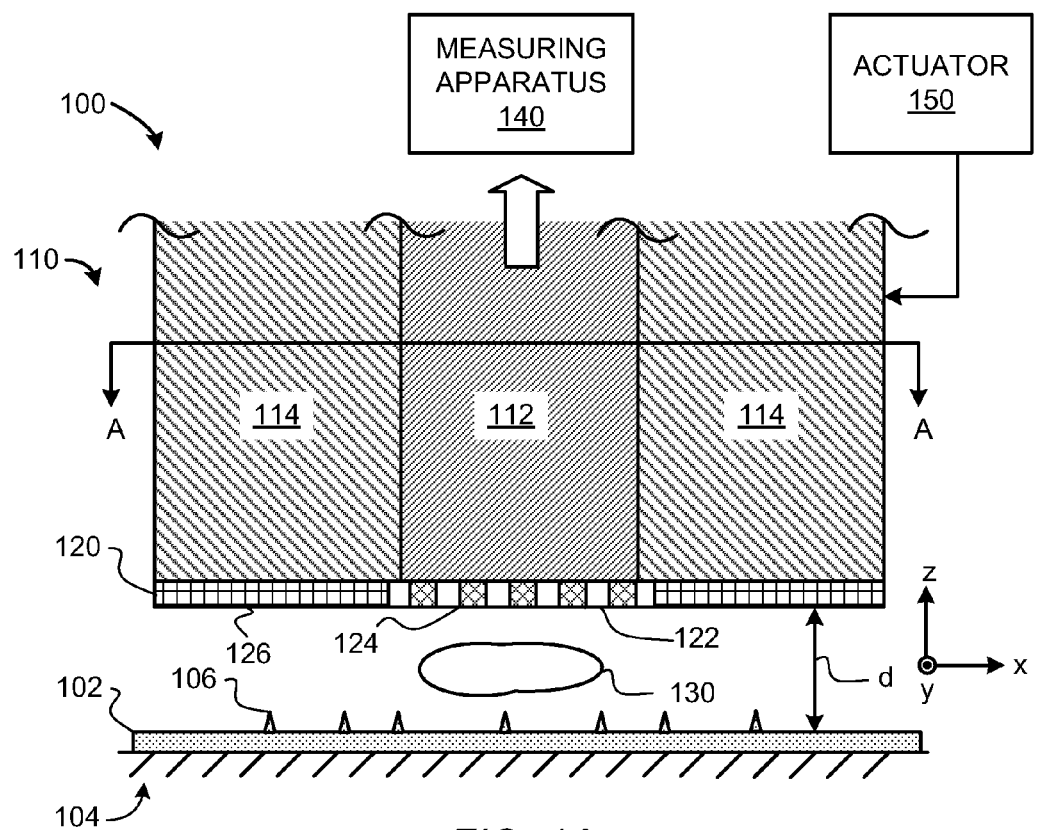
FIG. 1A shows a cross-sectional side view of an optical apparatus configured in accordance with one or more embodiments of the invention.

With reference first to FIG. 1A, there is shown a cross-sectional side view of an optical apparatus 100 configured in accordance with one or more embodiments of the present invention. It should be understood that the optical apparatus 100 depicted in FIG. 1A may include additional components and that some of the components described herein may be removed and/or modified without departing from a scope of the optical apparatus 100. In addition, it should be understood that the optical apparatus 100 has not been drawn to scale, but instead, has been drawn to clearly show the relationships between the components of the optical apparatus 100.

As depicted in FIG. 1A, the optical apparatus 100 includes an active optical layer 102 composed of a plurality of active optical elements 106 disposed above a reflective device 104 and an optical fiber 110, in which a cavity 130 is formed between an end portion of the optical fiber 110 and the reflective device 104. The optical fiber 110 is depicted as having a core 112 surrounded by cladding 114. The core 112 may be formed of a relatively high index material, such as, glass or suitable plastics. In addition, the cladding 114 comprises a relatively low index material compared to the core 112. Examples of suitable low index materials include, for instance, oxide glass, halide glass, polymers, plastics, etc. In operation, therefore, certain optical rays are introduced into the core 112 and are totally-internally reflected at the core-cladding interface and are thus, substantially confined within the core 112. The number of modes that the optical fiber 110 may support generally increases with the diameter of the core 112. Thus, the optical fiber 110 may be a single-mode or a multi-mode optical fiber 110.

The optical fiber 110 is further depicted as including an optical layer 120 positioned on an end portion of the optical fiber 110. The optical layer 120 is composed of a material having a relatively high refractive index, such as, silicon, plastic, diamond, etc. As shown in FIG. 1A, the optical layer 120 includes a first portion 122 having a non-periodic sub-wavelength grating ("NPSWG") 124, in which the NPSWG 124 extends across at least the diameter of the core 112. In one embodiment, the diameter of the first portion 122 is greater than the diameter of the core 112 to substantially ensure that light is directed through the NPSWG 124 prior to being emitted into the core 112. In any regard, and as discussed in greater detail herein below, the NPSWG 124 comprises one or more patterns that reflect light in a predetermined spatial mode across the sub-wavelength grating. For instance, the NPSWG 124 may be composed of various sections having differing levels of reflectivity (non-periodic) to thereby cause the light reflected from the NPSWG 124 to have a predetermined pattern. As a particular example, the NPSWG 124 is patterned to operate as a concave mirror. In this example, the NPSWG 124 is configured to amplify the axial, transverse, and polarization modes with the lowest loss within the cavity 130.

The optical layer 120 also includes a second portion 126 that surrounds the first portion 122. The second portion 126 also extends over the cladding 114 and has a configuration that differs from the first portion 122. For instance, the second portion 126 does not include the NPSWG 124 of the first portion 122. Alternatively, however, the entire optical layer 120 may be patterned to have the NPSWG 124 pattern of the first portion 122 or other pattern. As a further alternative, the second portion 126 of may comprise a different material than the first portion 122. In this example, for instance, the second portion 126 may comprise a material having a relatively lower refractive index since light is not required to travel through the second portion 126.

In any regard, the optical layer 120 may be positioned on the end portion of the optical fiber 110 in any reasonably suitable manner, such as, through coating of the end portion with the optical layer 120, through use of heat or adhesives to bond the optical layer 120 onto the end portion of the optical fiber 110, etc. For instance, the optical layer 120 may be deposited onto the end portion of the optical fiber 110 and the NPSWG 124 may be formed into the first portion 122 of the deposited optical layer 120. As another example, the NPSWG 124 may be patterned onto the first portion 122 of the optical layer 120 and the patterned optical layer 120 may be attached to the end portion of the optical fiber 110 through any suitable attachment mechanisms, such as, through application of heat, adhesives, etc. In any regard, the NPSWG 124 may be formed using any of, for instance, reactive ion etching, focusing beam milling, nanoimprint lithography, etc.

Light emitted or existent in the cavity 130 is configured to be reflected back and forth between the NPSWG 124 and the reflective device 104 at a resonance frequency of the cavity 130 depending upon the distance (d) between the NPSWG 124 and the reflective device 104. In addition, the NPSWG 124 is configured to focus the reflected light toward the reflective device to thus minimize loss of the light in the lateral (x and y) directions. In addition, the light is configured to be reflected back and forth between the first portion 122 and the reflective device 104 to form a high quality cavity mode in the cavity 130 between the optical layer 120 and the reflective device 104. Although the reflective device 104 is described particularly herein below as comprising a Distributed Bragg Reflector (DBR) or a second NPSWG, it should be clearly understood that the reflective device 104 may comprise a mirror or other suitable optical device for reflecting light back toward the NPSWG 124 with a substantially minimized amount of loss.

According to an embodiment, one or more characteristics of the cavity 130 may be modified by varying a relative position of the optical fiber 110 with respect to the reflective device 104. More particularly, for instance, one or both of the optical fiber 110 and the reflective device 104 may be moved with respect to the other one of the optical fiber 110 and the reflective device 104. In a first example, an actuator 150, for instance, an encoder, microelectromechanical systems (MEMS), or other actuating device, is configured vary the position of end portion of the optical fiber 110 in the z-direction with respect to the reflective device 104 to thereby vary the distance "d" between the optical fiber 110 and the reflective device 104. In a second example, the actuator 150 is configured to move the reflective device 104 in the z-direction with respect to the optical fiber 110, to thereby vary the distance "d" between the optical fiber 110 and the reflective device 104. As a further example, the actuator 150 may be configured vary an angle of at least one of the optical fiber 110, the reflective device 104, and the active optical layer 102 with respect to any of the other ones of the optical fiber 110, the reflective device 104, and the active optical layer 102.

In one regard, by varying the distance "d" between the optical fiber 110 and the reflective device 104, the volume of the high quality cavity mode and/or the resonance frequency of the light reflected between the NPSWG 124 and the reflective device 104 may be varied to thereby achieve desired conditions. In effect, for instance, the distance "d" may be varied to achieve a focusing effect on the light reflecting between the NPSWG 124 and the reflective device 104. More particularly, for instance, the distance "d" may be varied to cause the frequency of the light being reflected between the NPSWG 124 and the reflective surface 104 to be reflected at a relatively high level.

In addition, or alternatively, the actuator 150 may be configured to move one or both of the optical fiber 110 and the reflective device 104 laterally with respect to each other, for instance, in either or both of the x and y directions to thereby vary the position of the cavity 130 formed between the NPSWG 124 and the reflective device 104. In this regard, light emitted or existent in various locations with respect to the reflective device 104 or an active optical layer 102 positioned above the reflective device 104 may be captured into the optical fiber 110. As a particular example, the perturbations on a surface of a non-active sample may be detected through movement of the cavity 130 across the surface of the non-active sample and detection of the optical characteristics of the sample. By way of another example in which the active optical layer 102 comprises a plurality of active optical elements 106, such as, semiconductor quantum dots, colloidal quantum dots, saturable absorbers, phase shifting elements, etc., the cavity 130 may be moved to enable the cavity 130 to be positioned to cause light emitted from an active optical element 106 to be directed into the cavity 130.

According to an embodiment, the NPSWG 124 is designed and configured to be slightly less reflective, for instance, less than about 1% less reflective, than the reflective device 104. In this regard, the NPSWG 124 is configured to allow a relatively small portion, for instance, less than about 1%, of the light being reflected between the NPSWG 124 and the reflective device 104 to be emitted through the NPSWG 124 and into the core 112. In addition, the light supplied into the core 112 may be transmitted with a minimal amount of loss to a measuring apparatus 140, which may be configured to detect the light, to perform, for instance, cavity quantum electrodynamics, quantum dot spectroscopy, etc. Various operations performed by the measuring apparatus 140 based upon the light received through the optical fiber 110 are beyond the scope of the present disclosure.

Although the optical apparatus 100 has been depicted as including a sample or active optical layer 102, it should be understood that the layer 102 may be omitted without departing from a scope of the optical apparatus 100. In addition, the active optical elements 106 may also be removed and/or positioned directly on a surface of the reflective device 104. In this regard, it should be noted that the cavity 130 may be formed between the NPSWG 124 and the reflective device 104 without requiring that an active optical element 106 be present in the cavity 130.

Figure 1B:
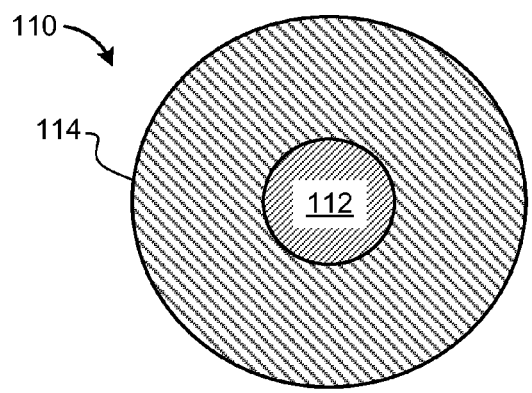
FIG. 1B shows a cross-sectional view of the optical fiber taken along line A-A in FIG. 1A, according to one or more embodiments of the invention.

Turning now to FIG. 1B, there is shown a cross-sectional view of the optical fiber 110 taken along line A-A of FIG. 1A, according to one or more embodiments of the invention. As shown therein, the optical fiber 110 comprises a generally circular cross-section, with the cladding 114 forming a barrier around the entire surface of the core 112. Alternatively, however, it should be understood that the optical fiber 110 may comprise various other configurations without departing from the scope of the optical apparatus 100 disclosed herein. For instance, the optical fiber 110 may comprise a cross-sectional shape other than a circle, such as, a rectangle, a square, a hexagon, etc. In addition, the core 112 may have a different cross-sectional shape than the cladding 114.

Figure 2A:
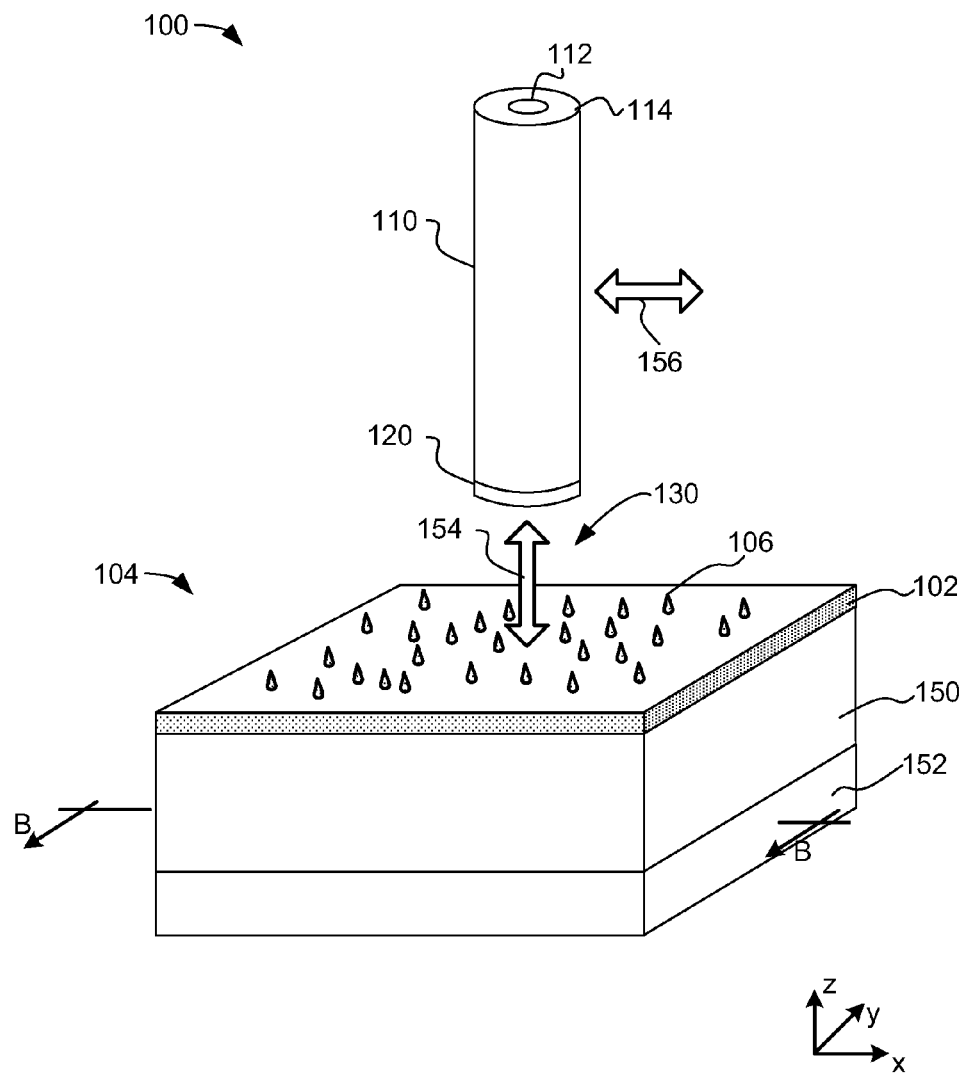
FIG. 2A shows a perspective view of the optical apparatus depicted in FIG. 1A, according to one or more embodiments of the invention.

With reference now to FIG. 2A, there is shown a perspective view of the optical apparatus 100 depicted in FIG. 1A, according to another embodiment. The optical apparatus 100 depicted in FIG. 2A includes all of the same features as those discussed above with respect to FIG. 1A, except that the reflective device 104 in FIG. 2A comprises a distributed Bragg reflector ("DBR") 150 disposed on a substrate 152. As such, the features of the optical apparatus 100 previously discussed with respect to FIG. 1A are not repeated here. In addition, the relative displacements that may be achieved between the optical fiber 110 and the reflective device 104 are depicted by the arrows 154 and 156.

The layers 150, 152, and the optical layer 120 may be composed of various combinations of suitable compound semiconductor materials. Compound semiconductors include III-V compound semiconductors and II-VI compound semiconductors. III-V compound semiconductors are composed of column IIIa elements selected from boron ("B"), aluminum ("Al"), gallium ("Ga"), and indium ("In") in combination with column Va elements selected from nitrogen ("N"), phosphorus C"P"), arsenic ("As"), and antimony ("Sb"). III-V compound semiconductors are classified according to the relative quantities of III and V elements, such as binary compound semiconductors, ternary compound semiconductors, and quaternary compound semiconductors. For example, binary semiconductor compounds include, but are not limited to, GaAs, GaAl, InP, InAs, and GaP; ternary compound semiconductors include, but are not limited to, $Al_yGa_{1-y}As$, $In_yGa_{y-1}As$ or $GaAs_yP_{1-y}$, where y ranges between 0 and 1; and quaternary compound semiconductors include, but are not limited to, $In_xGa_{1-x}As_yP_{1-y}$, where both x and y independently range between 0 and 1. II-VI compound semiconductors are composed of column IIb elements selected from zinc ("Zn"), cadmium ("Cd"), mercury ("Hg") in combination with Via elements selected from oxygen ("O"), sulfur ("S"), and selenium ("Se"). For example, suitable 11-VI compound semiconductors includes, but are not limited to, CdSe, ZnSe, ZnS, and ZnO are examples of binary II-VI compound semiconductors. In addition, the layers of the reflective device 104 may be formed, for instance, using molecular beam epitaxy, chemical vapor deposition, physical vapor deposition, wafer bonding, etc.

Figure 2B:
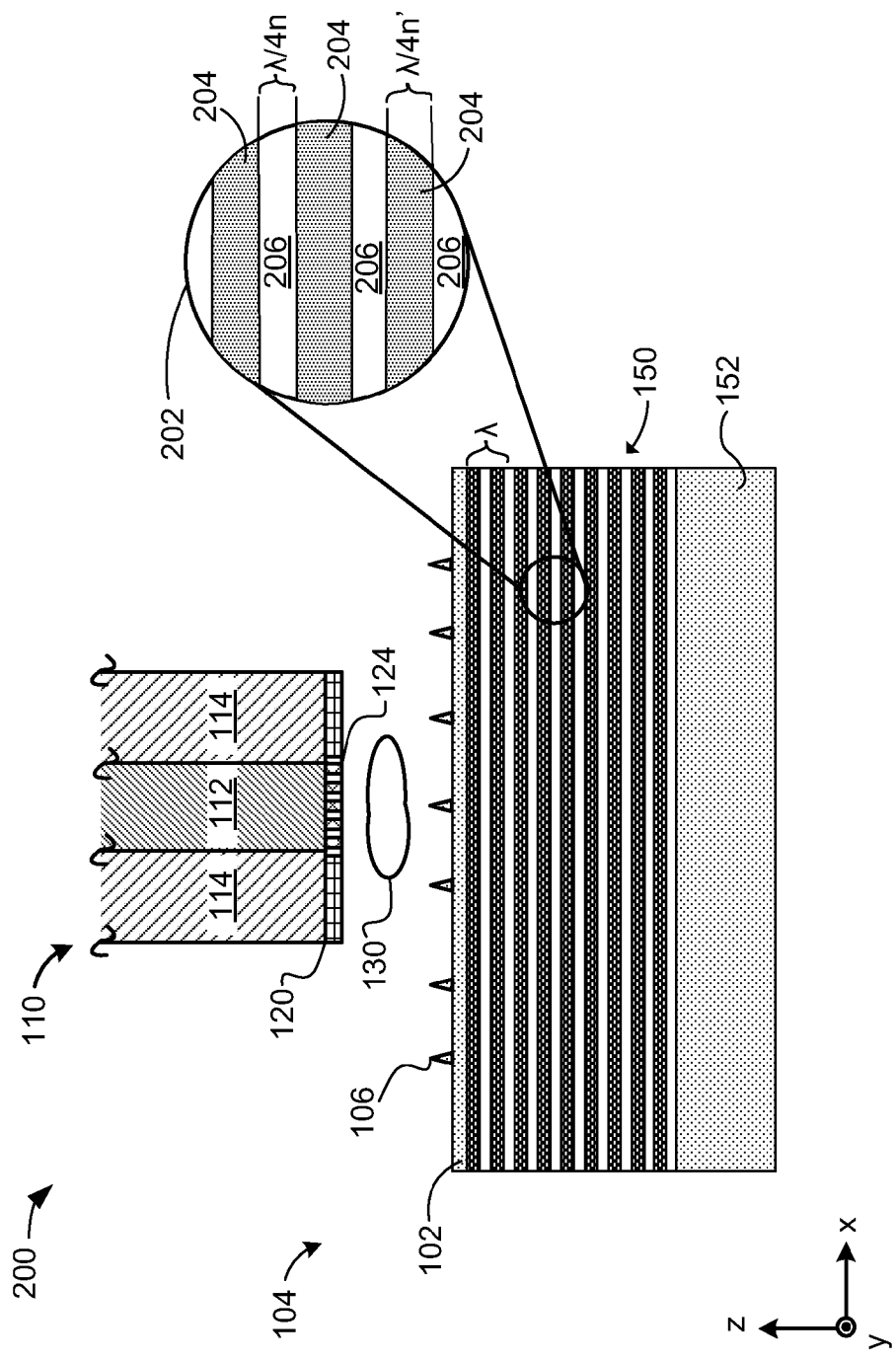
FIG. 2B shows a cross-sectional view of the reflective device along a line B-B in FIG. 2A, according to one or more embodiments of the invention.

FIG. 2B shows a cross-sectional view of the reflective device 104 along a line B-B, shown in FIG. 2A, in accordance with one or more embodiments of the present invention. The cross-sectional view reveals the structure of the individual layers forming the reflective device 104. The DBR 150 is composed of a stack of DBR pairs oriented parallel to the active optical layer 102. In practice, the DBR 150 may be composed of about 15 to about 40 or more DBR pairs. Enlargement 202 of a sample portion of the DBR 150 reveals that the layers of the DBR 150 each have a thickness of about $\lambda/4n$ and $\lambda/4n'$, where $\lambda$ is the desired vacuum wavelength of light emitted from the active optical layer 102, and n is the index of refraction of the DBR layers 206 and n' is the index of refraction of the DBR layers 204. Dark shaded layers 204 represent DBR layers composed of a first semiconductor material, and light shaded layers 206 represent DBR layers composed of a second semiconductor material with the layers 204 and 206 having different associated refractive indices. For example, layers 204 may be composed of GaAs, which has an approximate refractive index of 3.6, layers 206 may be composed AlAs, which has an approximate refractive index of 2.9, and the substrate may be composed of GaAs or AlAs.

As described above, the NPSWG 124 pattern of the optical layer 120 configured in accordance with one or more embodiments of the present invention provides reflective functionalities including control of the shape of the wavefront of the light reflected back into the DBR 150. This may be accomplished by configuring the NPSWG 124 with a configuration that controls both the phase and pattern in the light reflected from the NPSWG 124, such that, certain sections of the NPSWG 124 are relatively more reflective than other sections of the NPSWG 124. In certain embodiments, as described below, the NPSWG 124 may be configured with sections having a relatively low reflection coefficient and sections having a relatively high reflection coefficient to thereby enable the NPSWG 124 to reflect light at various amplitudes across the surface of the NPSWG 124.

Figure 3A:
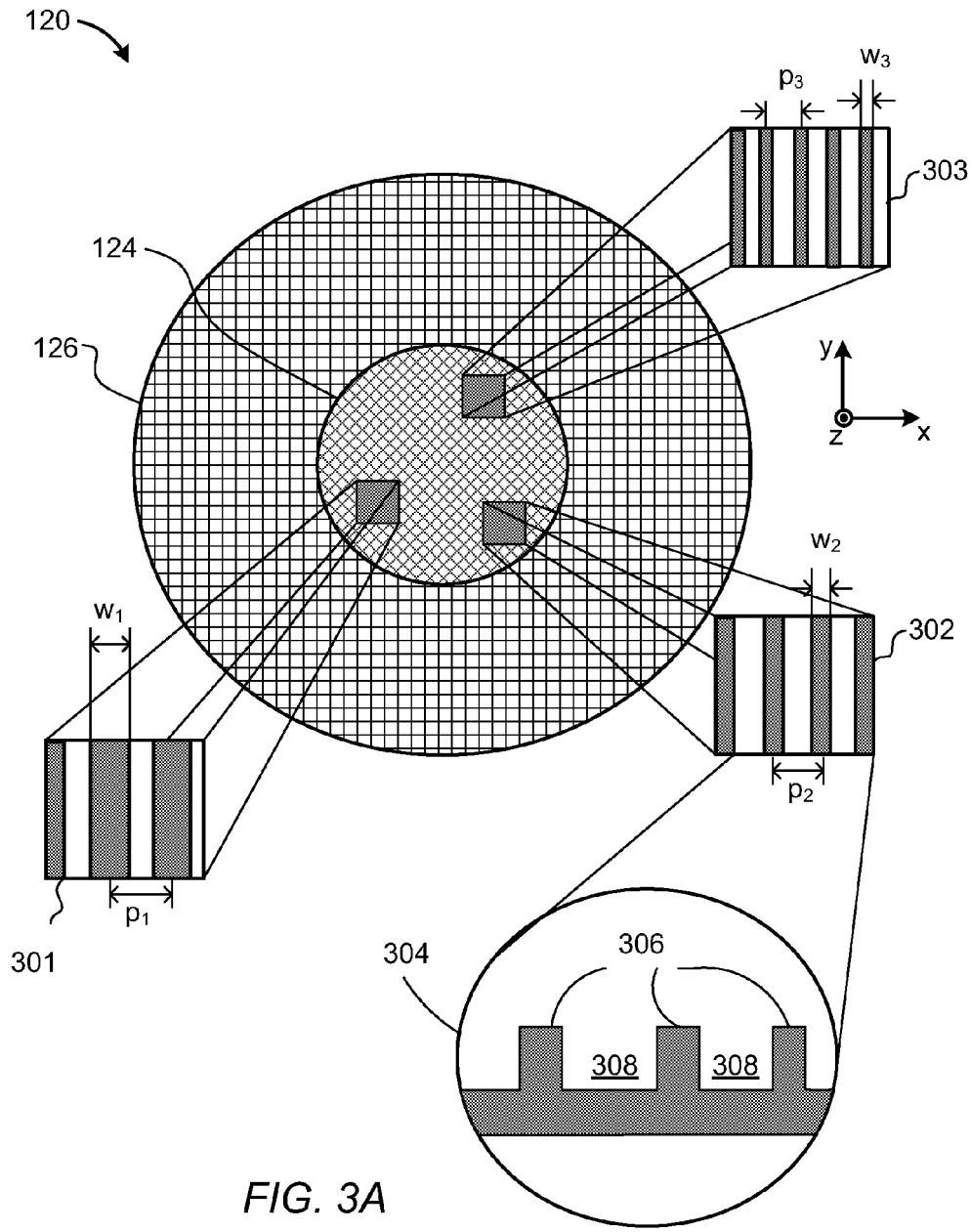
FIGS. 3A-3C illustrate respective bottom plan views of a sub-wavelength dielectric grating depicted in FIG. 2B, according to embodiments of the invention.

FIG. 3A shows a bottom plan view of an optical layer 120 composed of a NPSWG 124 configured with a one dimensional grating pattern formed in the optical layer 120 in accordance with one or more embodiments of the present invention. The one-dimensional grating pattern is composed of a number of sections containing one-dimensional grating sub-patterns arranged to reflect light at differing intensity levels, for instance, to focus reflected light to a point, similar to a concave mirror. In the example of FIG. 3A, three grating sub-patterns 301-303 are enlarged. In the embodiment represented in FIG. 3A, each grating sub-pattern comprises a number of regularly spaced wire-like portions of the NPSWG 124 material called "lines" formed in the NPSWG 124. The lines extend in the y-direction and are periodically spaced in the x-direction. In other embodiments, the line spacing can be continuously varying to produce a desired pattern in the beams of light reflected/refracted by the NPSWG 124. FIG. 3A also includes an enlarged end-on view 304 of the grating sub-pattern 302, which shows that the lines 306 are separated by grooves 308. Each sub-pattern is characterized by a particular periodic spacing of the lines and by the line width in the x-direction. For example, the sub-pattern 301 comprises lines of width $w_1$ separated by a period $p_1$, the sub-pattern 302 comprises lines with width $w_2$ separated by a period $p_2$, and the sub-pattern 303 comprises lines with width $w_3$ separated by a period $p_3$.

The grating sub-patterns 301-303 form sub-wavelength gratings that preferentially reflect incident light polarized in one direction, i.e., the x-direction, provided the periods $p_1$, $p_2$, and $p_3$ are smaller than the wavelength of the incident light. For example, the lines widths may range from approximately 10 nm to approximately 300 nm and the periods can range from approximately 20 nm to approximately 1μm depending on the wavelength of the incident light. The light reflected from a region acquires a phase $\phi$ determined by the line thickness t, and the duty cycle $\eta$ defined as:

$$\eta = \frac{w}{p}$$

where w is the line width and p is the period spacing of the lines.

The NPSWG 124 may be configured to apply a particular phase change to reflected light while maintaining sections that have a relatively low reflectivity level and sections that have a relatively high reflectivity level to thereby reflect the light in a predetermined pattern. The one-dimensional NPSWG 124 may be configured to reflect the x-polarized component or the y-polarized component of the incident light by adjusting the period, line width and line thickness of the lines. For example, a particular period, line width and line thickness may be suitable for reflecting the x-polarized component but not for reflecting the y-polarized component; and a different period, line width and line thickness may be suitable for reflecting the y-polarized component but not for reflecting the x-polarized component. In this regard, particular periods, line widths and line thicknesses may be selected for various sections of the NPSWG 124 to thereby control the pattern of the light reflected from the NPSWG 124.

Figure 3B:
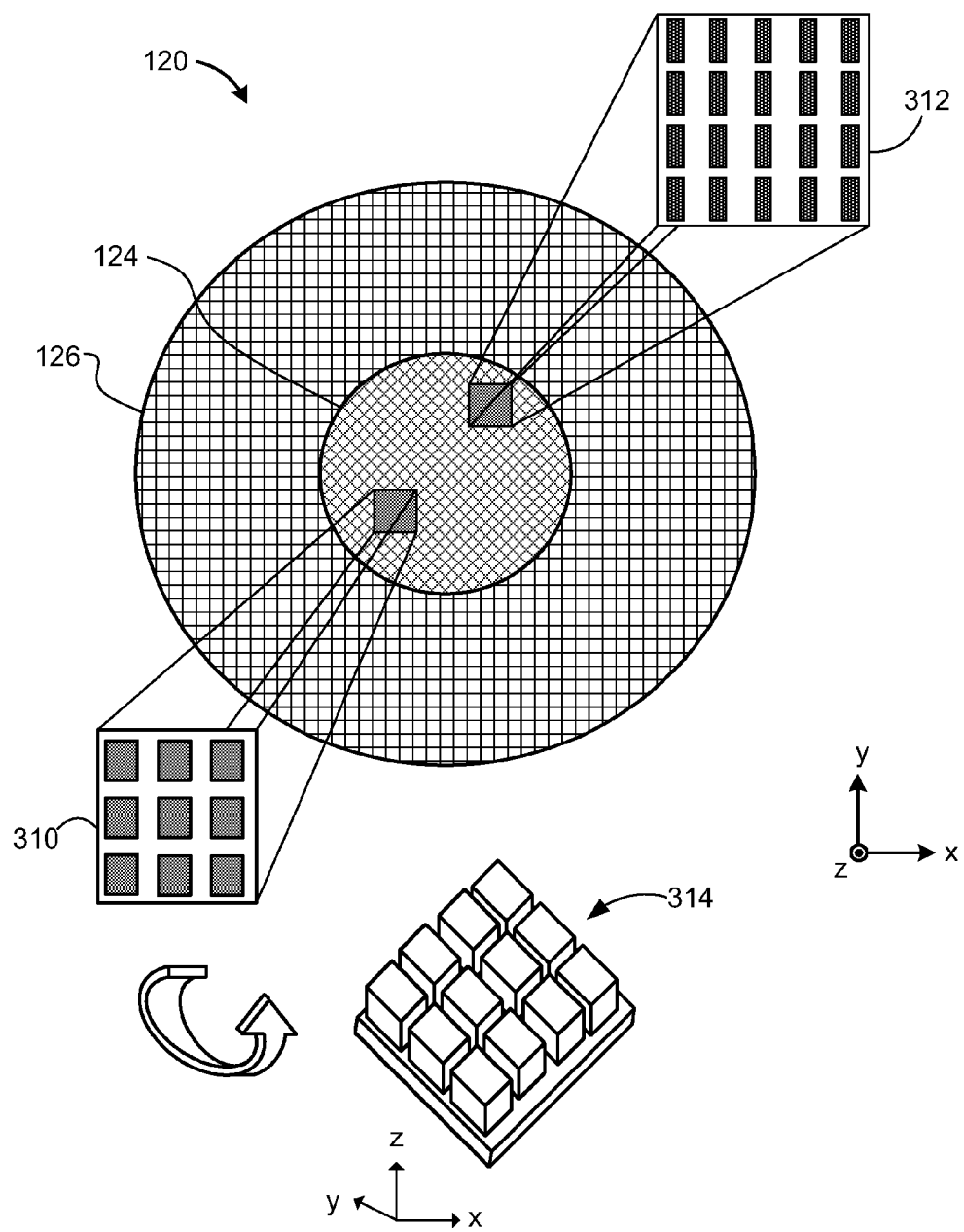
Figure 3C:
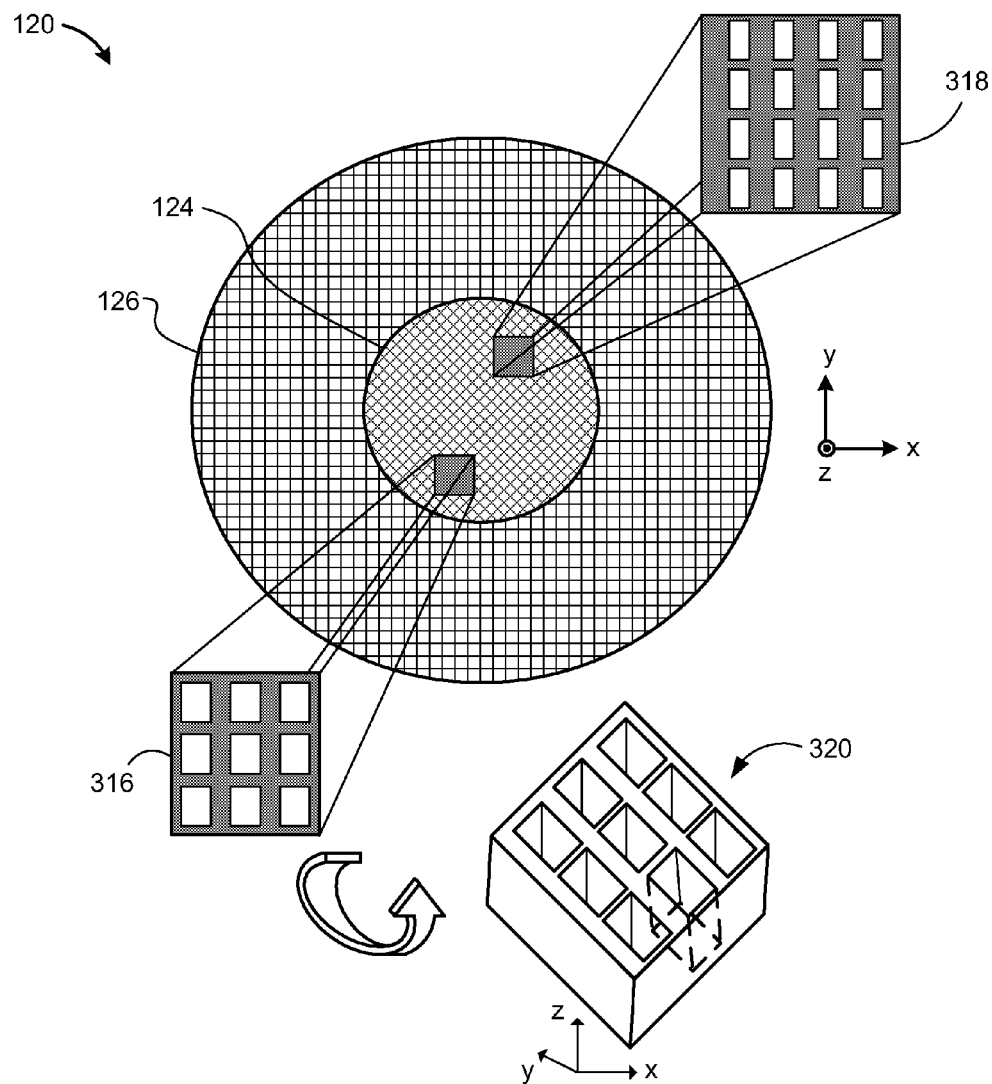

Embodiments of the present invention are not limited to one-dimensional gratings. A NPSWG may be configured with a two-dimensional, non-periodic grating pattern to reflect polarity insensitive light. FIGS. 3B-3C show bottom plan views of two example planar NPSWGs with two-dimensional sub-wavelength grating patterns in accordance with one or more embodiments of the present invention. In the example of FIG. 3B, the NPSWG is composed of posts rather lines separated by grooves. The duty cycle and period may be varied in the x- and y-directions. Enlargements 310 and 312 show two different post sizes. FIG. 3B includes an isometric view 314 of posts comprising the enlargement 310. Embodiments of the present invention are not limited to rectangular shaped posts, in other embodiments that posts may be square, circular, elliptical or any other suitable shape. In the example of FIG. 3C, the NPSWG is composed of holes rather than posts. Enlargements 316 and 318 show two different rectangular-shaped hole sizes. The duty cycle may be varied in the x- and y-directions. FIG. 3C includes an isometric view 320 comprising the enlargement 316. Although the holes shown in FIG. 3C are rectangular shaped, in other embodiments, the holes may be square, circular, elliptical or any other suitable shape.

In other embodiments, the line spacing, thickness, and periods may be continuously varying in both one- and two-dimensional grating patterns to produce a desired pattern in the reflected light.

Figure 4:
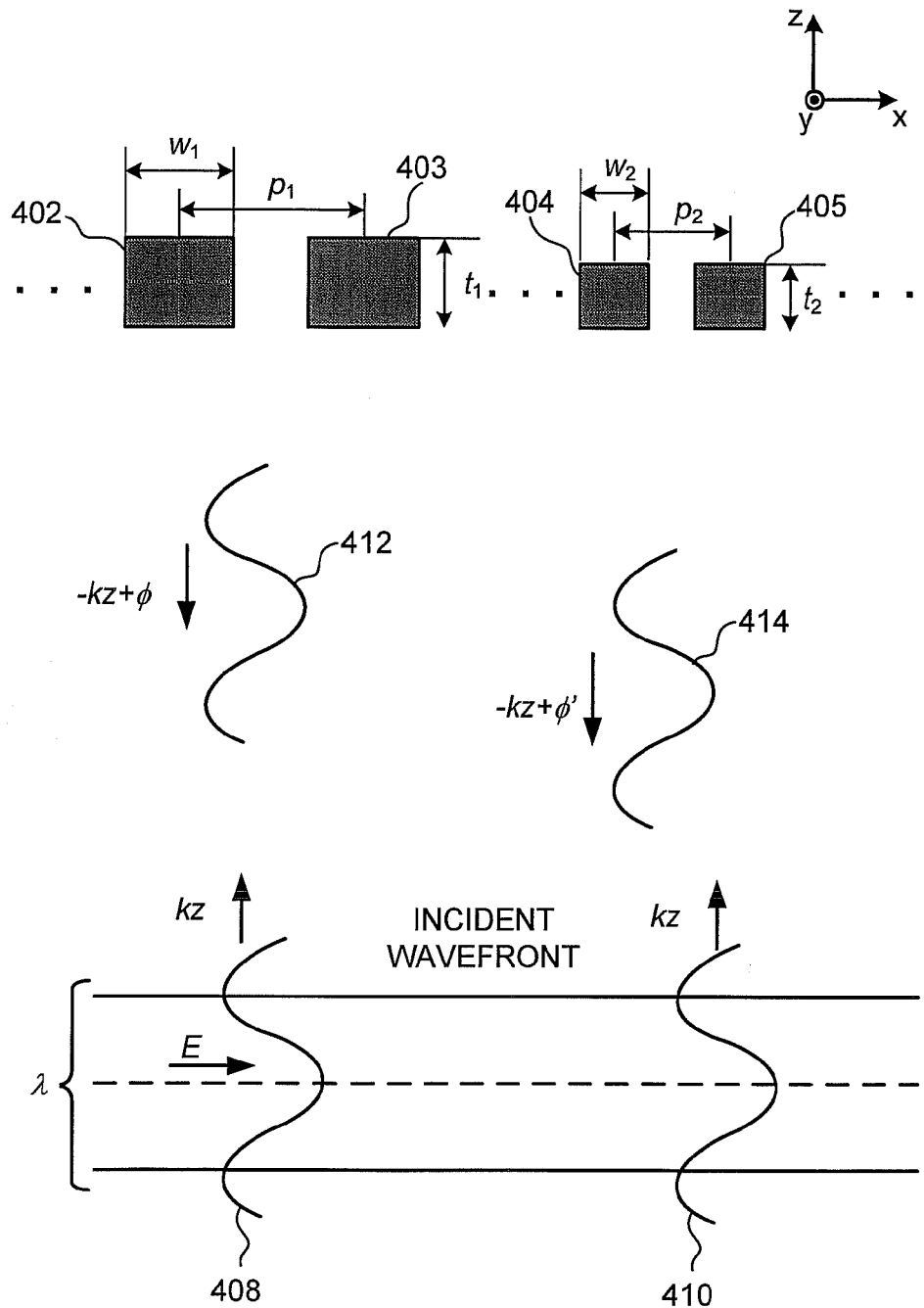
FIG. 4 shows a cross-sectional view of lines from two separate grating sub-patterns revealing the phase acquired by reflected light, according to one or more embodiments of the invention.

Each of the grating sub-patterns 301-303 also reflects incident light polarized in one direction, for instance, the x-direction, differently due to the different duty cycles and periods associated with each of the sub-patterns. FIG. 4 shows a cross-sectional view of lines from two separate grating sub-patterns revealing the phase acquired by reflected light in accordance with one or more embodiments of the present invention. For example, lines 402 and 403 may be lines in a first grating sub-pattern located in the NPSWG 400, and lines 404 and 405 may be lines in a second grating sub-pattern located elsewhere in the NPSWG 400. The thickness $t_1$ of the lines 402 and 403 is greater than the thickness $t_2$ of the lines 404 and 405, and the duty cycle $\eta_1$ associated with the lines 402 and 403 is also greater than the duty cycle $\eta_2$ associated with the lines 404 and 405. Light polarized in the x-direction and incident on the lines 402-405 becomes trapped by the lines 402 and 403 for a relatively longer period of time than the portion of the incident light trapped by the lines 404 and 405. As a result, the portion of light reflected from the lines 402 and 403 acquires a larger phase shift than the portion of light reflected from the lines 404 and 405. As shown in the example of FIG. 4, the incident waves 408 and 410 strike the lines 402-405 with approximately the same phase, but the wave 412 reflected from the lines 402 and 403 acquires a relatively larger phase shift $\phi$ than the phase $\phi'$ (i.e., $\phi > \phi'$) acquired by the wave 414 reflected from the lines 404 and 405. By controlling the phase shifts of the lines 402-405, the level of reflectivity at various sections of the NPSWG 124 may also be controlled.

Figure 5:
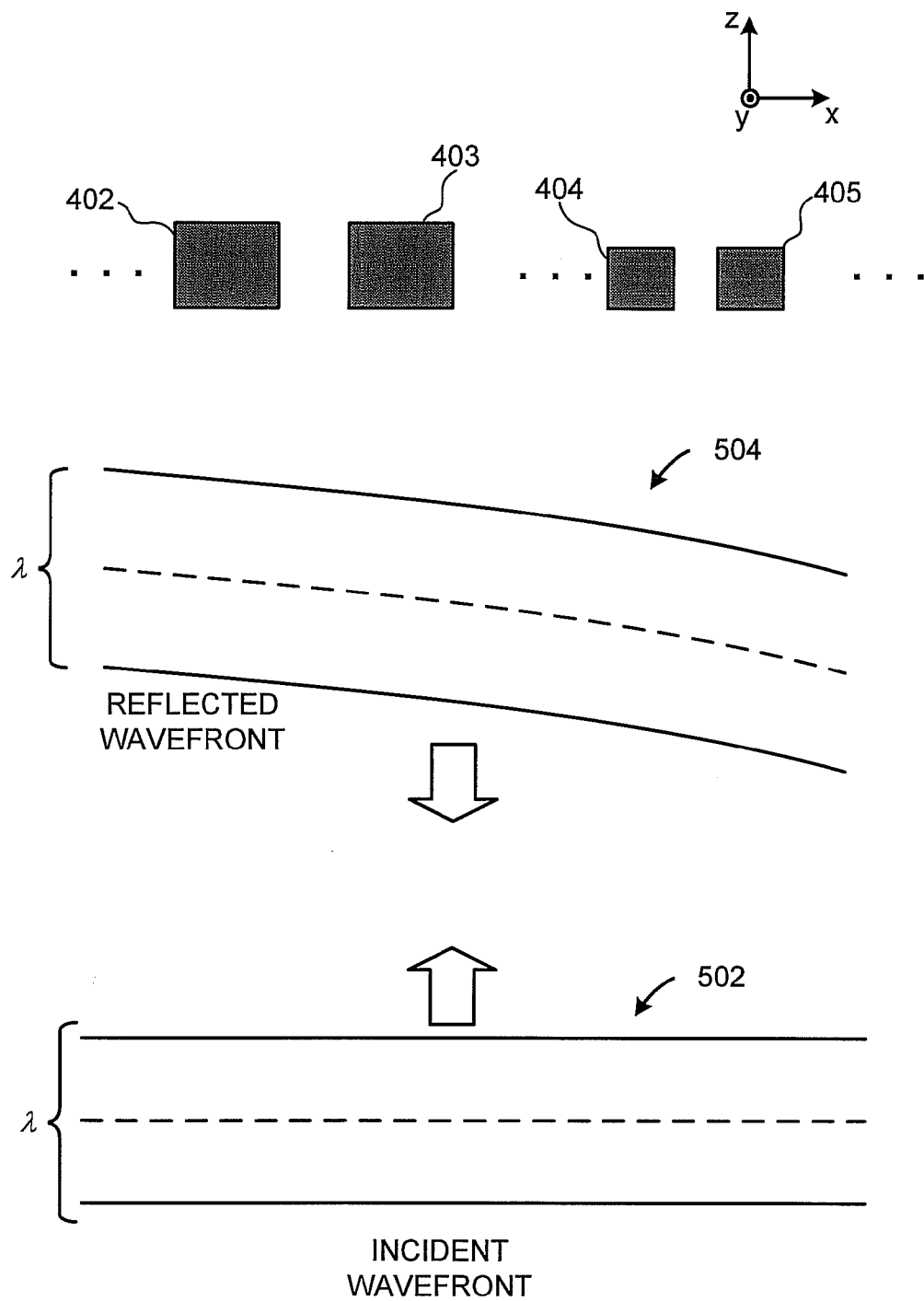
FIG. 5 shows a cross-sectional view of the lines revealing how the reflected wavefront changes, according to one or more embodiments of the invention.

FIG. 5 shows a cross-sectional view of the lines 402-405 revealing how the reflected wavefront changes in accordance with one or more embodiments of the present invention. As shown in the example of FIG. 5, incident light with a substantially uniform wavefront 502 strikes the lines 402-405 producing reflected light with a curved reflected wavefront 504. The curved reflected wavefront 504 results from portions of the incident wavefront 502 interacting with the lines 402 and 403 with a relatively larger duty cycle $\eta_1$ and thickness $t_1$ than portions of the same incident wavefront 502 interacting with the lines 404 and 405 with a relatively smaller duty cycle $\eta_2$ and thickness $t_2$. The shape of the reflected wavefront 504 is consistent with the larger phase acquired by light striking the lines 402 and 403 relative to the smaller phase acquired by light striking the lines 404 and 405.

By varying the duty cycle and thicknesses of the lines 402-405 with respect to each other, the reflected wavefront may be controlled to have relatively complex patterns. For instance, the lines 402-405 may be designed and configured to have a ring shape by causing the lines 402-405 near the center of the NPSWG 300 to be configured to be less reflective than the lines 402-405 positioned outside of the center area of the NPSWG 300.

Figure 6:
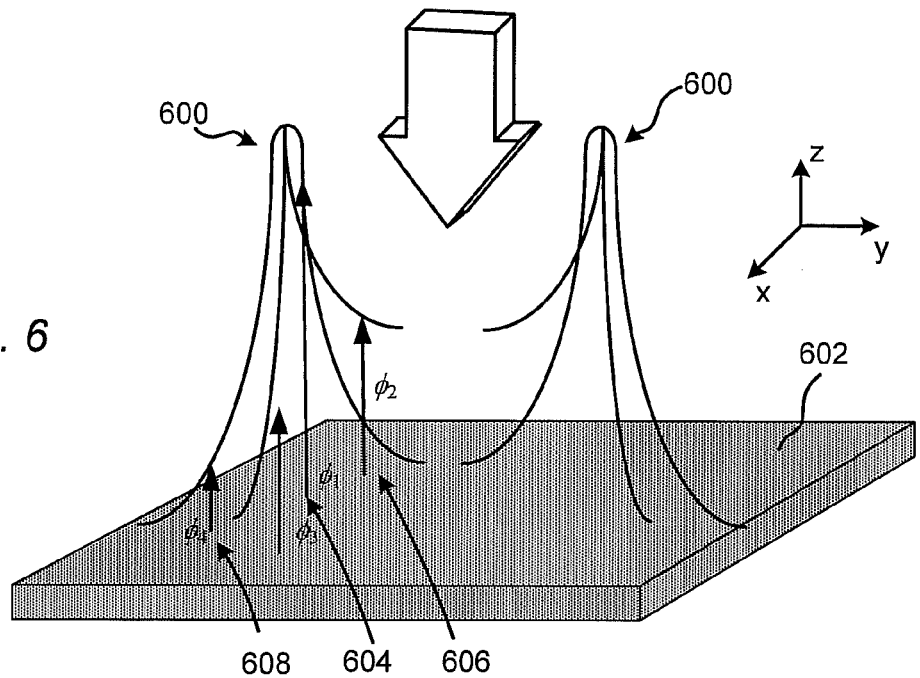
FIG. 6 shows an isometric view of an exemplary phase change contour map produced by a particular grating pattern of a NPSWG, according to an embodiment of the invention.

FIG. 6 shows an isometric view of an exemplary phase change contour map 600 produced by a particular grating pattern of a NPSWG 602 in accordance with one or more embodiments of the present invention. The contour maps 600 represent the magnitudes of the phase changes acquired by light reflected from the NPSWG 602. In the example shown in FIG. 6, the grating pattern of the NPSWG 602 produces contour maps 600 with the largest magnitudes in the phases acquired by the light reflected around the center of the NPSWG 602, with the magnitudes of the phases acquired by reflected light decreasing toward the center of the NPSWG 602 as toward the edges of the NPSWG 602. For example, light reflected from a sub-pattern 604 acquires a phase of $\phi_1$ and light reflected from a sub-pattern 606 acquires a phase of $\phi_2$. Because $\phi_1$ is much larger than $\phi_2$, the light reflected from the sub-pattern 606 acquires a much larger phase than the light reflected from the sub-pattern 608. In addition, the sub-pattern 604 is configured to have a relatively higher reflection coefficient than the sub-pattern 606, and thus, the light reflected from those sub-patterns 604 and 606 will have different amplitudes, which results in the reflected light having a non-Gaussian spatial mode across the NPSWG 602.

The phase change in turn shapes the wavefront of light reflected from the NPSWG into a desired pattern. For example, as described above with reference to FIGS. 4 and 5, lines having a relatively larger duty cycle produce a larger phase shift in reflected light than lines having a relatively smaller duty cycle. As a result, a first portion of a wavefront reflected from lines having a first duty cycle lags behind a second portion of the same wavefront reflected from a different set of lines configured with a second relatively smaller duty cycle. Embodiments of the present invention include patterning the NPSWG to have sections of varying levels of reflectivity to control the phase change and ultimately the pattern of the reflected light.

Figure 7:
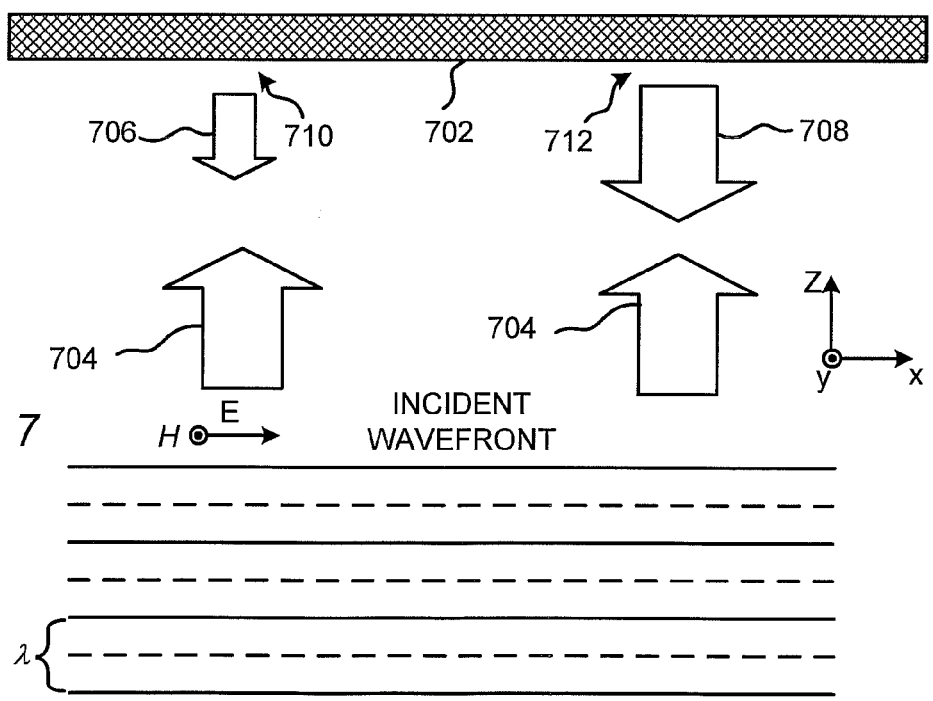
FIG. 7 shows a side view of a NPSWG configured with multiple sections having different reflection coefficients to cause light to be reflected to be reflected to have a desired pattern, according to one or more embodiments of the invention.

FIG. 7 shows a side view of a NPSWG 702 configured with multiple sections having different reflection coefficients to cause light to be reflected to have a desired pattern in accordance with one or more embodiments of the present invention. As shown in FIG. 7, light in the incident wavefront has a first intensity as indicated by the size of the arrows 704. The light is reflected from a surface of the NPSWG 702 as indicated by the arrows 706 and 708. The arrows 706 and 708 have different sizes, which indicate that the first arrow 706 has a lower intensity level as compared with the second arrow 708. More particularly, a first section 710 of the NPSWG 702 is composed of a pattern of lines that are arranged and configured to have a relatively low reflection coefficient and a second section 712 of the NPSWG 702 is composed of a pattern of lines that are arranged and configured to have a relatively high reflection coefficient.

Various manners in which the period and duty cycle may be varied to design and fabricate NPSWG patterns described in the copending Ser. No. 12/767,474 application for patent may be employed to design and fabricate the NPSWG 124 disclosed herein.

Optical Apparatus Operation and Cavity Configurations

Figure 8:
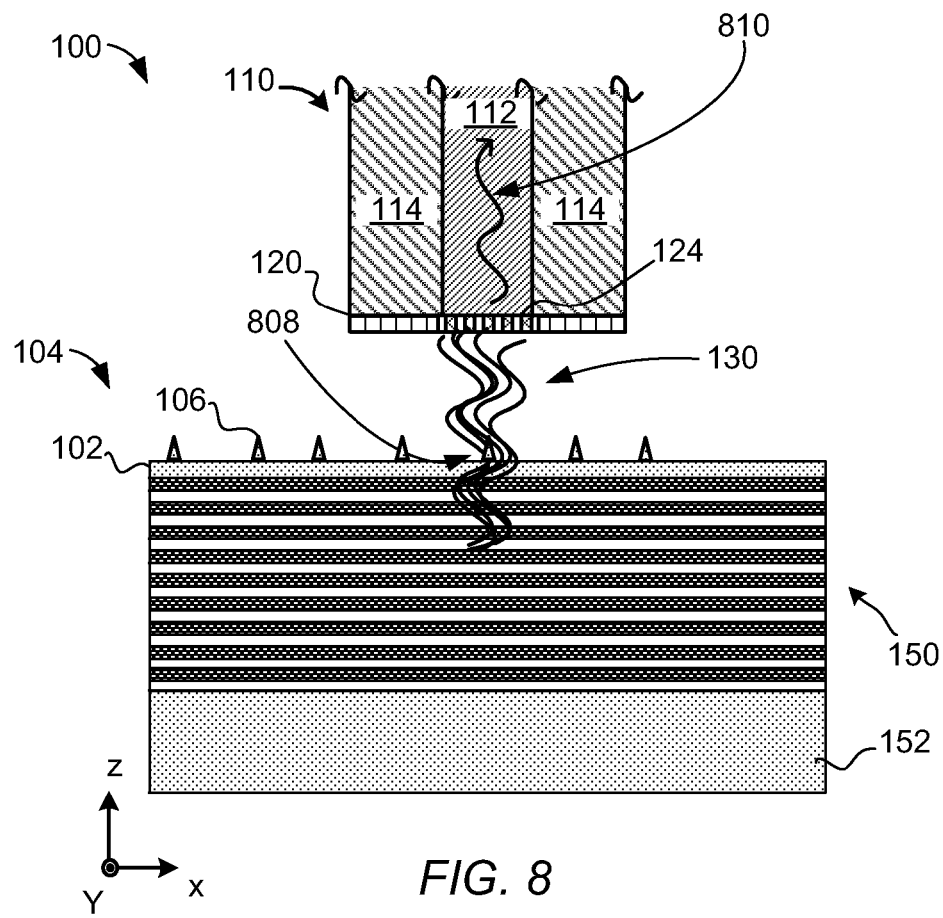
FIG. 8 shows a cross-sectional view of the resonant cavity of the optical apparatus depicted in FIG. 1, according to one or more embodiments of the invention.

FIG. 8 shows a cross-sectional view of the resonant cavity 130 of the optical apparatus 100, in accordance with one or more embodiments of the present invention. As described above, a cavity 130 is formed between the NPSWG 124 and the DBR 150 and light is reflected back and forth between the NPSWG 124 and the DBR 150 through the cavity 130. The light may be reflected over a relatively narrow range of wavelengths back into an active optical element 106. The light reflected back into the active optical element 106 may stimulate the emission of more light from the active optical element 106 in a chain reaction. Note that although the active optical element 106 may initially emit light over a range of wavelengths via spontaneous emission, the NPSWG 124 is configured to select a wavelength, $\lambda$, to reflect back into the active optical element 106 causing stimulated emission. This wavelength is referred to as the longitudinal, axial, or z-axis mode. Over time, the gain in the active optical element 106 becomes saturated by the longitudinal mode and the longitudinal mode begins to dominate the light emissions from the active optical element 106 and other longitudinal modes decay. In other words, light that is not reflected back and forth between the NPSWG 124 and the DBR 150 leaks out of the reflective device 104 with no appreciable amplification and eventually decays as the longitudinal mode supported by the cavity begins to dominate.

The dominant longitudinal mode reflected between the NPSWG 124 and the DBR 150 is amplified as it sweeps back and forth across the active optical element 106 producing standing waves 808 that terminate within the NPSWG 124 and extend into the DBR 150, as shown in FIG. 8. Ultimately, a substantially coherent beam of light 810 with the wavelength $\lambda$ may emerge from the NPSWG 124 and into the core 112 of the optical fiber 110. Light emitted from the active optical element 106 penetrates the DBR 150 and the NPSWG 124 and adds a contribution to the round trip phase of the light in the cavity 130.

Figure 9:
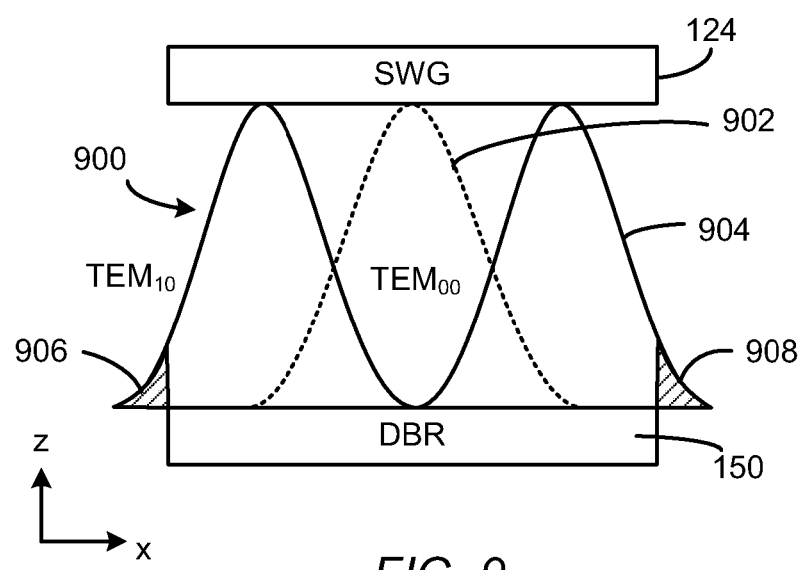
FIG. 9 shows an example of two transverse modes created in a cavity formed by the NPSWG and the DBR, according to one or more embodiments of the invention.

FIG. 9 shows an example of two transverse modes created in a cavity 902 formed by the NPSWG 124 and the DBR 150 in accordance with one or more embodiments of the present invention. As described above, the NPSWG 124 may be configured to define the size of the cavity 900. As shown in FIG. 9, the $TEM_{00}$ mode, is represented by dotted curve 902 and the $TEM_{10}$ mode is represented by solid curve 904. The $TEM_{00}$ mode has no nodes and lies entirely within the cavity 900. On the other hand, the $TEM_{10}$ mode has one node along the x-direction and portions 906 and 908 lie outside the cavity 900. As a result, during gain saturation, because the $TEM_{00}$ mode lies entirely within the cavity 900, $TEM_{00}$ mode is amplified. However, because portions of the $TEM_{10}$ mode lie outside the cavity 900, the $TEM_{10}$ mode decreases during gain saturation and eventually decays, while the $TEM_{00}$ mode continues to amplify. Other $TEM_{mn}$ modes that cannot be supported by, or lie entirely within, the cavity 900 also decay.

Figure 10:
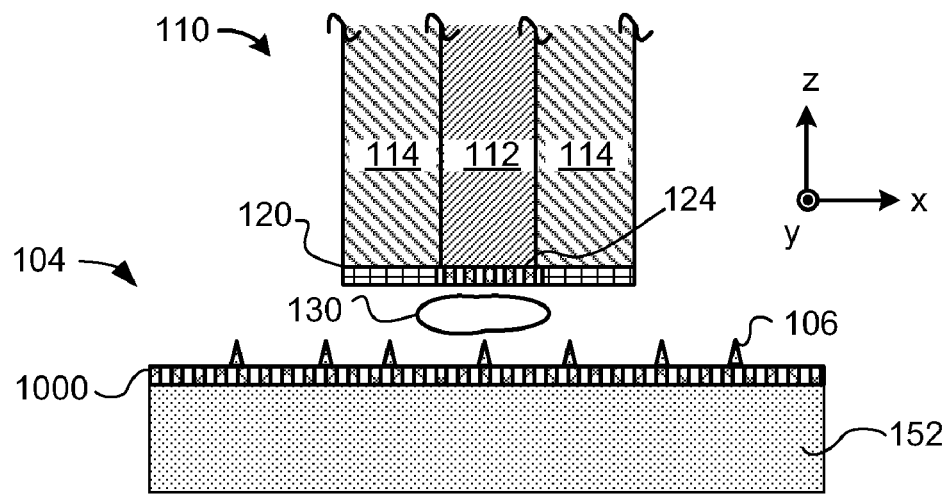
FIG. 10 shows a cross-sectional view of an example reflective device, according to one or more embodiments of the invention.

In still other embodiments of the present invention, the DBR layer 150 may be replaced by a second NPSWG 1000, as shown in FIG. 10, which shows a cross-sectional view of an example reflective device 104 configured in accordance with one or more embodiments of the present invention. The reflective device 104 has a nearly identical configuration as the reflective device 104 depicted in FIG. 2B, except the DBR 150 is replaced by a second NPSWG 1000. The second NPSWG 1000 may be configured with either a one-dimensional or two-dimensional grating pattern to operate in the same or similar manner as the NPSWG 124 described above. Alternatively, however, the second NPSWG 1000 may be configured to have a relatively high reflectance coefficient throughout the surface of the second NPSWG 1000. In any regard, the NPSWG 124 and the second NPSWG 1000 may be configured to direct reflected light into a cavity 130. In addition, the NPSWG 124 may have a slightly lower reflectively level than the second NPSWG 1000 to thus enable a portion of the light that is reflected between the NPSWG 124 and the second NPSWG 1000 to be emitted into the core 112 of the optical fiber 110.

Figure 11:
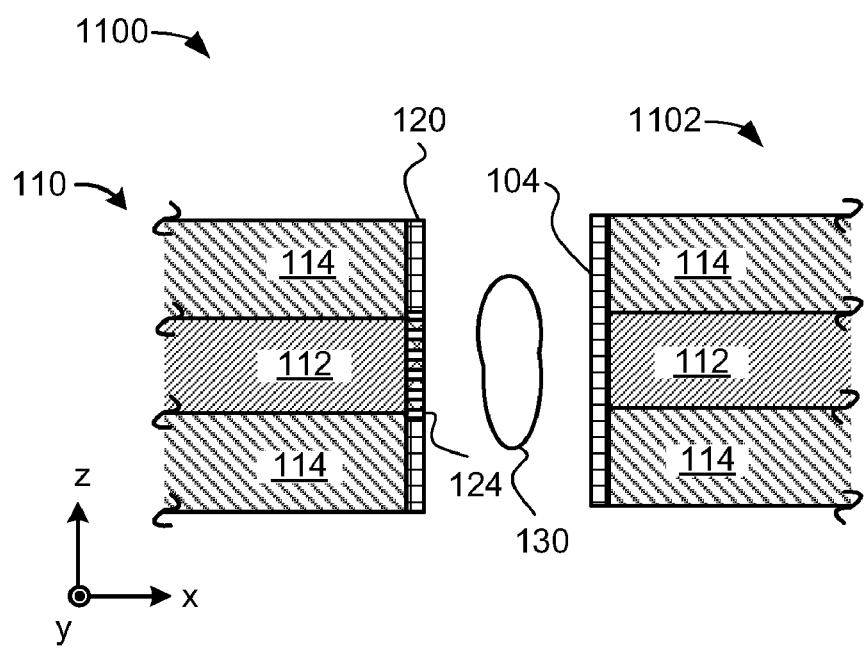
FIG. 11 shows a cross-sectional view of an optical apparatus, according to one or more embodiments of the invention.

In a further embodiment of the invention, the reflective device 104 may be positioned on a second optical fiber 1102 as shown in the optical apparatus 1100 of FIG. 11. As shown therein, the second optical fiber 1102 may comprise a similar configuration as the optical fiber 110. In addition, a cavity 130 is configured to be formed between the NPSWG 124 and the reflective device 104 in manners similar to those discussed above. Moreover, the positions of one or both of the optical fibers 110 and 1102 may be varied with respect to the other one of the optical fibers 110 and 1102 to tune the cavity 130 formation and to properly align the optical fibers 110 and 1102. Furthermore, the reflective device 104 may comprise any of the reflective devices discussed above.

Figure 12:
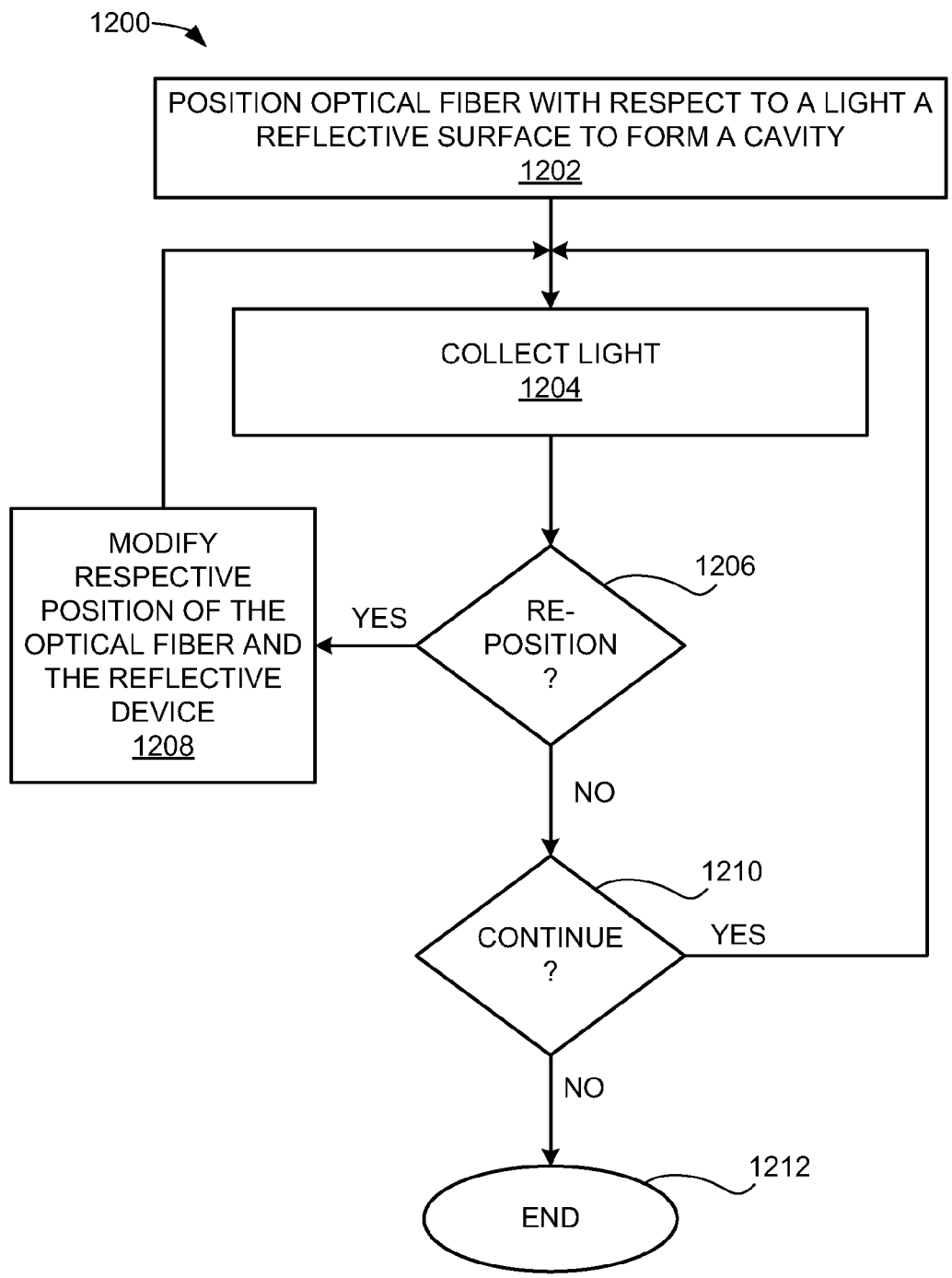
FIG. 12 shows a flow diagram of a method for forming a cavity having a tunable resonance frequency, according to one or more embodiments of the invention.

FIG. 12 shows a flow diagram of a method 1200 for forming a cavity having a tunable resonance frequency, in accordance with one or more embodiments of the present invention. It should be understood that the method 1200 is a generalized illustration and that additional steps may be added and/or existing steps may be modified or removed without departing from the scope of the method 1200.

At step 1202, the end portion of the optical fiber 110 comprising the optical layer 120 is positioned in spaced relation to the reflective device 104 to form the cavity 130. In addition, light reflects between the NPSWG 124 and the reflective device 104 at a relatively high quality factor mode. According to an embodiment, the light is emitted from an active optical element 106, such as, a semiconductor quantum dot, a colloidal quantum dot, a saturable absorber, a phase shifting element, etc. In one example, the light may be emitted from the active optical element 106 as a naturally occurring effect of the active optical element 106, such as, as the quantum dot decays. In another example, the active optical element 106 may emit light in response to being optically or electrically pumped.

In any regard, the light is configured to be reflected back and forth between the NPSWG 124 and the reflective device 104. The reflected light may stimulate the emission of light from the active optical element 106. As a further result, the light within the cavity 130 begins to amplify and the stimulated light coupled into the lowest loss axial, transverse, and polarization modes is preferentially amplified by the NPSWG layer 124 in the reflective device 104. In addition, so long as gain saturation has not been achieved, axial, transverse, and polarization modes with the lowest loss are amplified within the cavity 130. According to a particular example, at step 1204, light with the preferred axial, transverse, and polarization modes are emitted through the NPSWG 124 and into the core 112 of the optical fiber 110, through which the light may be collected.

At step 1206, a decision as to whether a position of at least one of the optical fiber 110, the reflective device 104, and the active optical layer 102 is to be modified is made. In response to a decision to modify the position of at least one of the optical fiber 110, the reflective device 104, and the active optical layer 102, the position of at least one of optical fiber 110, the reflective device 104, and the active optical layer 102 is modified at step 1208. As discussed above with respect to FIG. 1, the position of at least one of the optical fiber 110, the reflective device 104, and the active optical layer 102 may be varied through operation of one or more actuators 150.

According to a first example, a decision to reposition at least one of these components may be based on the intensity of the light collected at step 1204. In this example, the relative distance between the reflective device 104 and the NPSWG 124 may be varied to, for instance, improve the high quality factor mode created in the cavity 130 between the NPSWG 124 and the reflective device 104. In another example, a decision to reposition at least one of these components may be based upon the number of active optical elements 106 in the active optical layer 102 from which light is to be collected. More particularly, for instance, the optical fiber 110 may be moved laterally with respect to the active optical layer 102 thereby collect light emitted from a different active optical element 106.

In addition, following modification of the position(s) at step 1208, light, for instance, emitted by an active optical element 106 may be collected again at step 1204 and steps 1206 and 1208 may be repeated until a determination that the position(s) are no longer to be varied at step 1206 is made. Following the "no" condition at step 1206, a determination as to whether the method 1200 is to be continued is made, as indicated at step 1210. In response to a determination that the method 1200 is to be continued, steps 1204-1210 may be repeated until a determination that the method 1200 is to be discontinued at step 1210 is made, at which point the method 1200 may end as indicated at step 1212.

Figure 13:
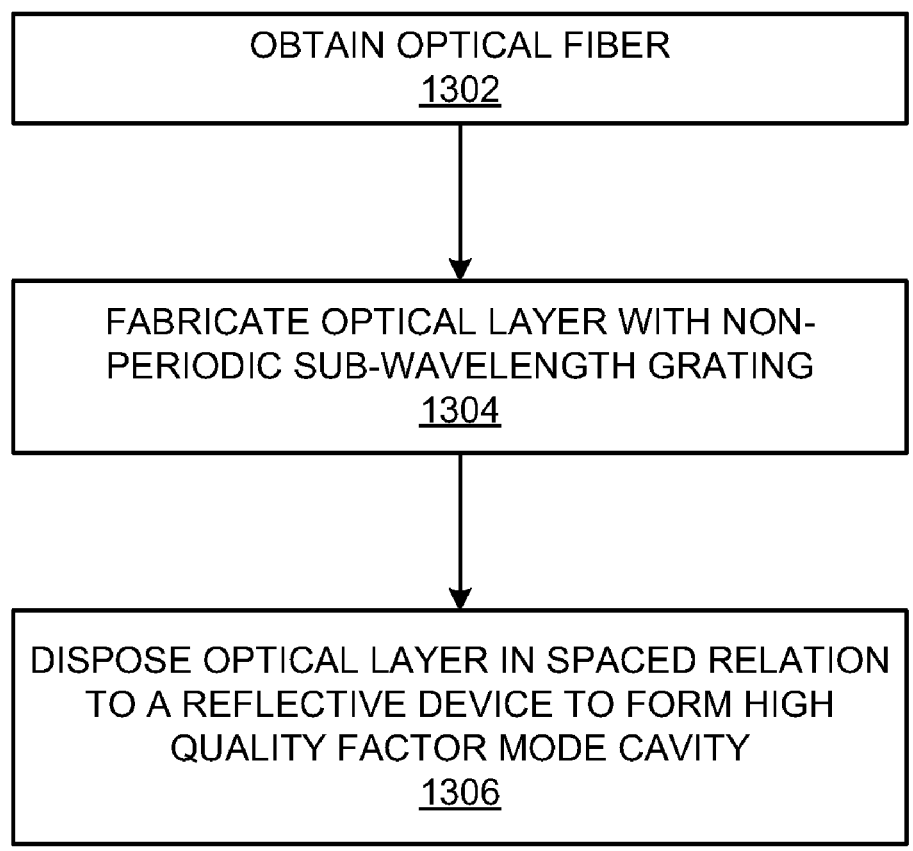
FIG. 13 shows a flow diagram of a method for forming a high quality factor mode cavity, according to one or more embodiments of the invention.

Turning now to FIG. 13, there is shown a flow diagram of a method 1300 for forming a high quality factor mode cavity 130, in accordance with one or more embodiments of the present invention. It should be understood that the method 1300 is a generalized illustration and that additional steps may be added and/or existing steps may be modified or removed without departing from the scope of the method 1300.

At step 1302, an optical fiber 110 formed of a core 112 surrounded by cladding 114 is obtained. In addition, at step 1304, a relatively highly refractive index material optical layer 120 having a NPSWG 124 is fabricated on an end portion of the optical fiber 110, such that the NPSWG 124 is positioned in optical communication with the core 112. As discussed above, the NPSWG 124 comprises a pattern that is configured to reflect light around a predetermined range of wavelengths with a relatively small amount of loss along at least one dimension. According to an example, at step 1204, the optical layer 120 is attached to the end portion of the optical fiber 110 and at least a portion of the optical layer 120 that extends over the core 112 is patterned to have the NPSWG 124. Alternatively, however, the NPSWG 124 maybe formed into the optical layer 120 prior to disposition of the optical layer 120 on the end portion of the optical fiber 110.

At step 1306, the end portion of the optical fiber 110 and the optical layer 120 are disposed in space relation to the reflective device 104 to form a relatively high quality factor mode cavity 130 between the NPSWG 124 and the reflective device 104.

According to an embodiment, the NPSWG 124 may be fabricated by determining a desired pattern of light to be reflected from the NPSWG 124, the desired pattern of light having varying levels of intensities, determining line widths, line period spacings, and line thicknesses for the grating layer corresponding to the desired pattern across the grating layer, and fabricating the grating layer to have a plurality of lines having the determined line widths, line period spacings, and line thicknesses. One or more of the steps in fabricating the NPSWG 124 may be performed by a computing device. For instance, the computing device may calculate the line widths, line period spacings, and line thicknesses for the grating layer corresponding to the desired pattern across the grating layer and may also control a micro-chip design tool (not shown) configured fabricate the NPSWG 124. Examples of various manners in which the computing device may determine the target phase changes across each of the SWGs 124 are described in the copending PCT Application No. PCT/US2009/051026.

According to an example, the micro-chip design tool is configured to pattern the lines of the SWGs 124 directly on a first layer of material. According to another example, the micro-chip design tool is configured to define a grating pattern of the lines in an imprint mold, which may be used to imprint the lines into a first layer positioned on the surface of a material from which the NPSWG 124 is fabricated. In this example, the imprint mold may be implemented to stamp the pattern of the lines into the first layer.

Figure 14:
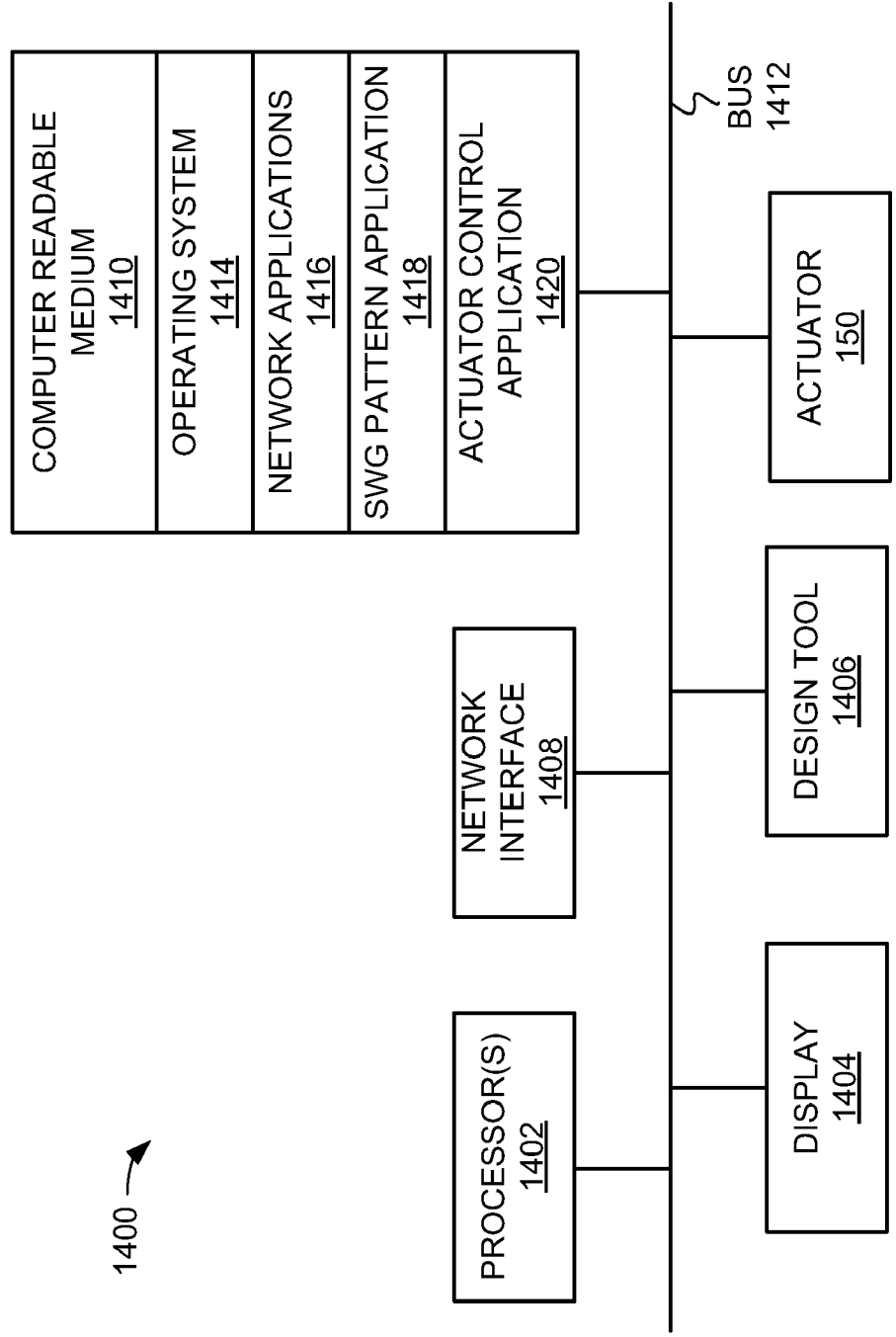
FIG. 14 shows a schematic representation of a computing device configured in accordance with one or more embodiments of the present invention.

The methods employed to fabricate the NPSWG 124 grating pattern with reference to FIG. 13 may thus be implemented by the computing device, which may be a desktop computer, laptop, server, etc. Turning now to FIG. 14, there is shown a schematic representation of a computing device 1400 configured in accordance with embodiments of the present invention. The device 1400 includes one or more processors 1402, such as a central processing unit; one or more display devices 1404, such as a monitor; a design tool interface 1406; one or more network interfaces 1408, such as a Local Area Network LAN, a wireless 802.11x LAN, a 3G mobile WAN or a WiMax WAN; and one or more computer-readable mediums 1410. Each of these components is operatively coupled to one or more buses 1412. For example, the bus 1412 may be an EISA, a PCI, a USB, a FireWire, a NuBus, or a PDS.

The computer readable medium 1410 may be any suitable medium that participates in providing instructions to the processor 1402 for execution. For example, the computer readable medium 1410 may be non-volatile media, such as an optical or a magnetic disk; volatile media, such as memory; and transmission media, such as coaxial cables, copper wire, and fiber optics. Transmission media can also take the form of acoustic, light, or radio frequency waves. The computer readable medium 1410 may also store other software applications, including word processors, browsers, email, Instant Messaging, media players, and telephony software.

The computer-readable medium 1410 may also store an operating system 1414, such as Mac OS, MS Windows, Unix, or Linux; network applications 1416; and a grating application 1418. The operating system 1414 may be multi-user, multiprocessing, multitasking, multithreading, real-time and the like. The operating system 1414 may also perform basic tasks such as recognizing input from input devices, such as a keyboard or a keypad; sending output to the display 1404 and the design tool 1406; keeping track of files and directories on medium 1410; controlling peripheral devices, such as disk drives, printers, image capture device; and managing traffic on the one or more buses 1412. The network applications 1416 includes various components for establishing and maintaining network connections, such as software for implementing communication protocols including TCP/IP, HTTP, Ethernet, USB, and FireWire.

The NPSWG pattern application 1418 provides various software components for generating grating pattern data, as described above. In certain embodiments, some or all of the processes performed by the application 1418 may be integrated into the operating system 1414. In certain embodiments, the processes can be at least partially implemented in digital electronic circuitry, or in computer hardware, firmware, software, or in any combination thereof.

According to an embodiment, the computing device 1400 may control the actuator 150 to manipulate the relative position of the optical fiber 110 and the reflective device 104, as discussed above with respect to FIG. 1A. In this regard, the computer-readable medium 1410 may also have stored thereon an actuator control application 1420, which provides various software components for controlling the actuator 150 in varying the position of one or both of the optical fiber 110 and reflective device 104 as discussed above.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. An optical apparatus for forming a tunable cavity, said optical apparatus comprising:
    an optical fiber formed of a core surrounded by cladding, said optical fiber comprising an end portion; and
    an optical layer positioned on the end portion, said optical layer including a non-periodic sub-wavelength grating comprising a pattern to cause the non-periodic sub-wavelength grating to operate as a concave minor positioned in optical communication with the core.

2. The optical apparatus according to claim 1, wherein the non-periodic sub-wavelength grating comprises a pattern that is to reflect light around a predetermined range of wavelengths with a lesser amount of loss along at least one dimension as compared with another dimension.

3. The optical apparatus according to claim 1, wherein the optical layer is formed of at least one of a glass, plastic, and diamond material.

4. The optical apparatus according to claim 1, further comprising:
    a reflective device positioned in spaced relation with respect to a free surface of the optical layer, wherein a cavity is formed between the non-periodic sub-wavelength grating and the reflective device.

5. The optical apparatus according to claim 4, wherein a position of at least one of the end portion of the optical fiber and the reflective device is to be varied with respect to the other one of the end portion of the optical fiber and the reflective device such that a lateral position of the end portion of the optical fiber is to be varied with respect to the reflective device to thereby vary the position of the cavity formed between the non-periodic sub-wavelength grating and the reflective device.

6. The optical apparatus according to claim 5, wherein at least one active optical element is positioned between the optical fiber and the reflective device and wherein the at position of at least one of the end portion of the optical fiber and the reflective device is to be varied to cause the at least one active optical element to be positioned in the cavity.

7. The optical apparatus according to claim 4, wherein a position of at least one of the end portion of the optical fiber and the reflective device is to be varied with respect to the other one of the end portion of the optical fiber and the reflective device such that a distance between the end portion of the optical fiber with respect to the reflective device is to be varied to thereby vary a resonance frequency and a quality factor of the cavity formed between the non-periodic sub-wavelength grating and the reflective device.

8. The optical apparatus according to claim 7, wherein at least one active optical element is positioned between the optical fiber and the reflective device and wherein the at position of at least one of the end portion of the optical fiber and the reflective device is to be varied to cause the resonance frequency of the cavity to be matched to the light emitted by the at least one active optical element.

9. The optical apparatus according to claim 4, wherein the reflective device comprises at least one of a distributed Bragg reflector and a second non-periodic sub-wavelength grating.

10. The optical apparatus according to claim 4, wherein the non-periodic sub-wavelength grating and the reflective device are to form a single mode resonant cavity for emitting a single mode of light through the non-periodic sub-wavelength grating and into the core.

11. The optical apparatus according to claim 4, further comprising:
a second optical fiber, wherein the reflective device is positioned on an end portion of the second optical fiber.

12. A method for forming a cavity having a tunable resonance frequency, said method comprising:
positioning an end portion of an optical fiber in spaced relation to a reflective device such that a cavity is formed between the end portion of the optical fiber and the reflective device, wherein the end portion of the optical fiber includes an optical layer including a non-periodic sub-wavelength grating positioned in optical communication with a core of the optical fiber; and
varying a position of at least one of the end portion of the optical fiber and the reflective device with respect to the other one of the end portion of the optical fiber and the reflective device to tune at least one of a position and a resonance frequency of the cavity.

13. The method according to claim 12, wherein varying a position of the at least one of the end portion of the optical fiber and the reflective device further comprises varying a lateral position of the end portion with respect to the reflective device to vary the position of the cavity formed between the non-periodic sub-wavelength grating and the reflective device.

14. The method according to claim 13, wherein varying a lateral position of the end portion with respect to the reflective device further comprises varying the lateral position of the end portion with respect to the reflective device to position an active optical element with the cavity.

15. The method according to claim 11, wherein varying a position of the at least one of the end portion of the optical fiber and the reflective device further comprises varying a distance between the end portion of the optical fiber with respect to the reflective device to vary a resonance frequency and a quality factor of the cavity formed between the non-periodic sub-wavelength grating and the reflective device.

16. The method according to claim to claim 15, wherein varying a distance between the end portion of the optical fiber with respect to the reflective device further comprises varying the distance to vary the resonance frequency of the cavity to match a frequency of light emitted by at least one active optical element.

17. The method according to claim 12, further comprising:
preferentially amplifying modes of light with a particular polarization supported by the cavity between the non-periodic sub-wavelength pattern and the reflective device.

18. A method for forming a high quality factor mode cavity, said method comprising:
obtaining an optical fiber formed of a core surrounded by cladding;
fabricating an optical layer on an end portion of the optical fiber, said optical layer including a non-periodic sub-wavelength grating comprising a pattern that is to cause the non-periodic sub-wavelength grating to operate as a concave mirror; and
disposing the optical fiber and the optical layer in spaced relation to a reflective device to form a high quality factor mode cavity.

19. The method according to claim 18, wherein fabricating the optical layer on the end portion of the optical fiber further comprises:
attaching the optical layer on the end portion of the optical fiber; and
patterning at least a portion of the optical layer extending over the core to have the non-periodic sub-wavelength grating.

20. An optical apparatus for forming a tunable cavity, said optical apparatus comprising:
an optical fiber formed of a core surrounded by cladding, said optical fiber comprising an end portion;
an optical layer composed positioned on the end portion, said optical layer including a non-periodic sub-wavelength grating positioned in optical communication with the core;
a reflective device positioned in spaced relation with respect to a free surface of the optical layer, wherein a cavity is formed between the non-periodic sub-wavelength grating and the reflective device; and
wherein a position of at least one of the end portion of the optical fiber and the reflective device is to be varied with respect to the other one of the end portion of the optical fiber and the reflective device to vary at least one of a position and a size of the cavity.

* * * * *

UNITED STATES PATENT AND TRADEMARK OFFICE
CERTIFICATE OF CORRECTION

PATENT NO. : 8,369,664 B2
APPLICATION NO. : 12/847429
DATED : February 5, 2013
INVENTOR(S) : David A. Fattal et al.

Page 1 of 1

It is certified that error appears in the above-identified patent and that said Letters Patent is hereby corrected as shown below:

In the Claims

In column 14, line 47, in Claim 1, delete "minor" and insert -- mirror --, therefor.

In column 16, line 12, in Claim 16, after "according to" delete "claim to".

Signed and Sealed this
Fourteenth Day of May, 2013

Teresa Stanek Rea
*Acting Director of the United States Patent and Trademark Office*